(12) United States Patent
Liang et al.

(10) Patent No.: US 12,381,520 B2
(45) Date of Patent: *Aug. 5, 2025

(54) METHOD AND CIRCUIT TO ISOLATE BODY CAPACITANCE IN SEMICONDUCTOR DEVICES (71) Applicant: Taiwan Semiconductor Manufacturing Co., Ltd., Hsin-Chu (TW)

(72) Inventors: Garming Liang, Hsin-Chu (TW); Simon Chai, Hsin-Chu (TW); Tzu-Jin Yeh, Hsinchu (TW); En-Hsiang Yeh, Hsin-Chu (TW); Wen-Sheng Chen, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/513,103

(22) Filed: Nov. 17, 2023

(65) Prior Publication Data
US 2024/0088842 A1 Mar. 14, 2024

Related U.S. Application Data (63) Continuation of application No. 18/081,513, filed on Dec. 14, 2022, now Pat. No. 11,855,590, which is a (Continued)

(51) Int. Cl.
H03F 1/22 (2006.01)
H03F 1/02 (2006.01)
(Continued)

(52) U.S. Cl.
CPC .......... *H03F 3/211* (2013.01); *H03F 1/0205* (2013.01); *H10D 84/811* (2025.01); *H10D 84/859* (2025.01); *H03F 1/223* (2013.01); *H03F 2200/451* (2013.01); *H03F 2200/72* (2013.01); *H03F 2200/75* (2013.01)

(58) Field of Classification Search
CPC ........ H03F 3/211; H03F 1/0205; H03F 1/223; H03F 2200/451; H03F 2200/72; H03F 2200/75; H03F 3/245; H03F 1/52; H03F 3/21; H03F 1/22; H03F 3/16;
(Continued)

(56) References Cited

U.S. PATENT DOCUMENTS 7,323,753 B2 * 1/2008 Henmi ................ H01L 27/0629 257/363
7,422,938 B2 9/2008 Williams et al.
(Continued)

FOREIGN PATENT DOCUMENTS

JP 2015192205 A 11/2015

*Primary Examiner* — Khanh V Nguyen
(74) *Attorney, Agent, or Firm* — STUDEBAKER BRACKETT PLLC (57) ABSTRACT Disclosed is an amplifying circuit and method. In one embodiment, an amplifying circuit, includes: a common-gate (CG) amplifier, wherein the CG amplifier comprises a first transistor, wherein source terminal and body terminal of the first transistor is coupled together through a first resistor.

20 Claims, 8 Drawing Sheets

Related U.S. Application Data continuation of application No. 16/673,765, filed on Nov. 4, 2019, now Pat. No. 11,558,019.

(60) Provisional application No. 62/767,734, filed on Nov. 15, 2018.

(51) Int. Cl.
  *H03F 3/21* (2006.01)
  *H10D 84/80* (2025.01)
  *H10D 84/85* (2025.01)

(58) Field of Classification Search
  CPC ........... H03F 2200/294; H01L 27/0629; H01L 27/0928; H01L 27/0727
  USPC .................................................. 330/277, 311
  See application file for complete search history.

(56) References Cited

U.S. PATENT DOCUMENTS

| | | | |
|---|---|---|---|
| 7,456,478 B2 * | 11/2008 | Tsutsumi | H01L 27/0928 |
| | | | 257/350 |
| 8,624,678 B2 * | 1/2014 | Scott | H03F 3/245 |
| | | | 330/285 |
| 8,836,429 B2 | 9/2014 | Murakami | |
| 9,276,534 B2 | 3/2016 | Ali | |
| 9,698,729 B2 * | 7/2017 | Bakalski | H03F 3/2171 |
| 9,704,853 B2 | 7/2017 | Bode et al. | |
| 9,799,646 B2 | 10/2017 | Liu et al. | |
| 9,882,531 B1 | 1/2018 | Willard et al. | |
| 10,211,822 B2 | 2/2019 | Stefanov et al. | |
| 2007/0075784 A1 | 4/2007 | Pettersson et al. | |
| 2016/0126906 A1 | 5/2016 | Maxim et al. | |

\* cited by examiner

| Parameter | Unit | without R | with R |
|---|---|---|---|
| 402 — Frequency | GHz | 28 | 28 |
| 404 — Gain | dB | 14.4 | 14.4 |
| 406 — OP1dB | dBm | 15.8 | 16.7 |
| 408 — PAE_1dB | % | 28.7 | 36.1 |
| 410 — PAE_MAX | % | 32.8 | 36.1 |

┌─────────────────────────────┐
│ Provide a first gate voltage on a first transistor with a resistor │ — 502
└─────────────────────────────┘
             ↓
┌─────────────────────────────┐
│ Provide a second voltage and a second transistor so as to generate a first output current │ — 504
└─────────────────────────────┘
             ↓
┌─────────────────────────────┐
│ Generate a second output current through the first transistor │ — 506
└─────────────────────────────┘

ND CIRCUIT TO ISOLATE BODY
METHOD AND CIRCUIT TO ISOLATE BODY CAPACITANCE IN SEMICONDUCTOR DEVICES

CROSS-REFERENCE TO RELATED APPLICATION

This application is a continuation of U.S. patent application Ser. No. 18/081,513, filed Dec. 14, 2022, which is a continuation application of U.S. patent application Ser. No. 16/673,765, filed Nov. 4, 2019, now U.S. Pat. No. 11,558,019, which claims the benefit of and priority to U.S. Patent Provisional Application No. 62/767,734, filed Nov. 15, 2018, the contents of each are incorporated by reference herein in their entireties.

BACKGROUND

In a standard CMOS (complementary metal-oxide-semiconductor) process, a NMOS transistor in a deep N-well (DNW) of a substrate is widely used due to its advantages, such as, no body effect, reduced Vgb (gate-to-body voltage) for time-dependent dielectric breakdown (TDDB) reliability issues, reduced substrate coupling, etc. Base on those, a CS (common source) amplifier and a CG (common gate) amplifier in a power amplifier are used to improve the dynamic range especially in low voltage supply. When the body terminal of the CG amplifier is shorted to ground with a low voltage supply, the CG amplifier suffers body effect, in which a threshold voltage increases and the dynamic range is reduced. When the body terminal of the CG amplifier is shorted to ground with a high voltage supply, because gate terminal of the CG amplifier is biased at a higher voltage level, it is susceptible to reliability issues, e.g., TDDB. Therefore, direct coupling of the body terminal and the source terminal in the CG amplifier is widely used for solving this problem. However, parasitic body capacitance from a diode, for example, between a P-Well and the DNW in a p-type substrate or a P-well in an n-type substrate, is largely counted for the degradation in frequency responses for example, unit-gain frequency (Ft) and losses. Therefore, there exists a need to reduce the body capacitance effect in a CG amplifier that can be used in various power amplifier, current buffer, and function blocks to prevent degradation in frequency responses.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

This disclosure presents various embodiments of a method and apparatus for reducing the body capacitance effect in a CG amplifier that can be used in various power amplifier, current buffer, and function blocks to prevent degradation in frequency responses.

Figure 1:
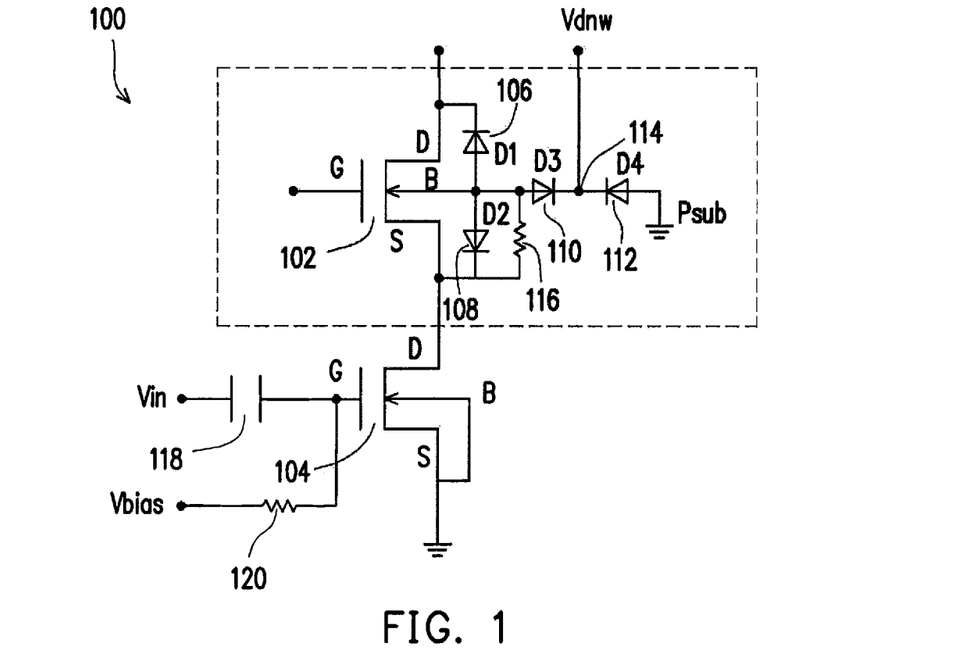
FIG. 1 illustrates an exemplary equivalent circuit diagram of a power amplifier, in accordance with some embodiments of present disclosure.

FIG. 1 illustrates an exemplary equivalent circuit diagram of a power amplifier 100, in accordance with some embodiments of present disclosure. In the illustrated embodiments, the power amplifier 100 comprises a common-gate (CG) amplifier 102 and a common-source amplifier 104. FIG. 1 is simplified for a better understanding of the concepts of the present disclosure. It is understood that the power amplifier 100 may comprise a number of other devices such as resistors, capacitors, inductors, fuses, diodes, etc., which are not shown in FIG. 1, for purposes of clarity of illustration.

In some embodiments, the CG amplifier 102 and the CS amplifier 104 each comprises an n-type metal-oxide-semiconductor (NMOS) transistor. The CG amplifier 102 and the CS amplifier 104 are coupled in series, wherein source terminal of the CG amplifier 102 is coupled to drain terminal of the CS amplifier 104. Source terminal of the CS amplifier 104 is coupled to GND and drain terminal of the CG amplifier 102 is coupled to VDD through an output load. (not be shown here, in some embodiments, the output load may be an inductor, an transformer, a resistor or any formed component). Further, in the illustrated embodiments, body terminal of the CG amplifier 102 is coupled to the source terminal of the CG amplifier 102 through a resistor 116. In some embodiments, the resistor 116 has a resistance value according to the operation frequency. In some embodiments, the resistance value of the resistor 116 is 10 kilo-ohm when operating at a frequency of 28 Giga-Hertz. The body terminal of the CG amplifier 102 is coupled to Vdnw to prevent latch-up occurrence. In some embodiments, the Vdnw is coupled directly to VDD. In some embodiments, the gate terminal of the CS amplifier 104 is coupled to an input (Vin) through a capacitor 118 and is further coupled to an external bias Vbias through a resistor 120. In some embodiments, the Vbias is generated by a biasing circuit.

In the illustrated embodiment, the CG amplifier 102 and CS amplifier 104 are fabricated using a standard CMOS fabrication process by fabricating a deep N-well in a p-type substrate for effective isolation purposes. In the illustrated embodiments, parasitic diodes formed at junctions between two oppositely doped regions in a corresponding semiconductor device fabricated using the standard CMOS fabrication process are also illustrated. Specifically, a first parasitic diode D1 106 is formed between an N region of the drain terminal of the NMOS transistor 102 and a P-well region; a second parasitic diode D2 108 is formed between an N region of the source terminal of the NMOS transistor 102 and the P-well region; a third parasitic diode D3 110 is formed between the P-well region and a deep N-well region; and a fourth parasitic diode D4 112 is formed between the deep N-well region 204 and a p-type substrate 202, which are discussed further in detail below. All these parasitic diodes are inherent at the junctions and especially, the parasitic diodes D3 and D4 are triggering sources of the latch-up occurrence in such CMOS devices.

Figure 2:
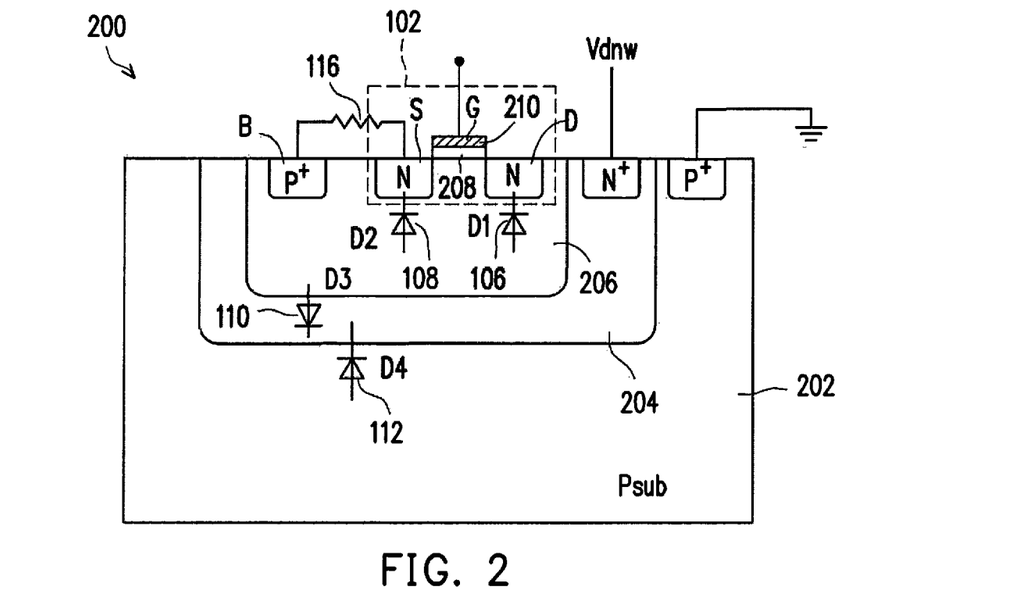
FIG. 2 illustrates a cross-sectional view of a portion of a semiconductor device, in accordance with some embodiments of the present disclosure.

FIG. 2 illustrates a cross-sectional view of a portion of a semiconductor device 200, in accordance with some embodiments of the present disclosure. The semiconductor device 200 may be included in a microprocessor, memory cell, and/or other integrated circuit (IC). Also, FIG. 2 is simplified for a better understanding of the concepts of the present disclosure. It is understood that the semiconductor device 200 may comprise a number of other devices such as resistors, capacitors, inductors, fuses, interconnection metallic layers, vias structures, and insulating layers etc., which are not shown in FIG. 2, for purposes of clarity of illustration.

In some embodiments, the substrate 202 includes a silicon substrate. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate 202 may have an epitaxial layer overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX) or other suitable technique, such as wafer bonding and grinding. In some embodiments, the substrate 202 is a p-type substrate.

In some embodiments, the semiconductor device 200 can be manufactured using conventional CMOS (complementary metal-oxide-semiconductor) process steps, including patterning using photolithography, deposition of a dielectric layer, etching of the dielectric layer, chemical-mechanical planarization (CMP) process, formation of a gate oxide layer, doping of the substrate, deposition of conductive layers, annealing, patterning metal contacts, formation of ohmic contact silicide, deposition of barrier layers, formation of via structures and interconnections metal lines, and a combination thereof. These processes can be performed by different techniques known to one skilled in the art.

As shown in the illustrated embodiment, a CG amplifier (i.e., NMOS transistor 102) is directly formed in a P-well region 206, which is fabricated in a deep N-well region 204 by fabricating a deep N-well region 204 in the p-type substrate 202. Source (S) and drain (D) terminals are directly fabricated in the P-well region 206 using heavily doped N+ regions and body (B) terminal is fabricated in the P-well region 206 using a heavily doped P+ region so as to form an ohmic contact to the P-well region 206. Further in the illustrated embodiment, a heavily doped N+ region, which is coupled to Vdnw, is fabricated to form an ohmic contact to the deep N-well region 204; and a heavily doped P+ region is formed directly in the p-type substrate which is further coupled to GND.

In some embodiments, a gate insulator 208 in the NMOS transistor 102 has a thickness of 3-4 nanometers. The thickness of the gate insulator 208 can be varied and controlled by the desired capacitance value, which is a function of the dielectric constant of the dielectric material of the gate insulator 208 and an operational voltage. In some embodiments, the gate insulator 208 in the NMOS transistor 102 comprises various insulating materials such as, for example $SiO_2$, $Al_2O_3$, $HfO_2$, $SiO_2$, $La_2O_3$, $ZrO_3$, Ba—Sr—Ti—O, $Si_3N_4$ and laminate of a mixture thereof. In some embodiments, the gate insulator 208 in the NMOS transistor 102 comprises a high dielectric constant, e.g., a high-k dielectric material. In some embodiments, the gate insulator 208 in the NMOS transistor 102 can be formed by various processes including deposition of the fourth dielectric layer using PVD (physical vapor deposition), CVD (chemical vapor deposition), ALD (atomic layer deposition) and the like, photolithography and a dry/wet etching process.

In some embodiments, a conductive gate 210 can be formed on top of the gate insulator 208. In some embodiments, the conductive gate 210 comprises various conductive materials such as, for example polycrystalline silicon. In some embodiments, a resistor 116 is coupled between the source terminal and the body terminal of the NMOS transistor 102. In the illustrated embodiments, parasitic diodes can be formed between two buried oppositely doped regions. Specifically, a first parasitic diode D1 106 is formed between the N region of the drain terminal of the NMOS transistor 102 and the P-well region 206; a second parasitic diode D2 108 is formed between the N region of the source terminal of the NMOS transistor 102 and the P-well region 206; a third parasitic diode D3 110 is formed between the P-well region 206 and the deep N-well region 204; and a fourth parasitic diode D4 112 is formed between the deep N-well region 204 and the p-type substrate 202. In some embodiments, the p-substrate 202 is coupled to Psub, which is further coupled to GND.

Figure 3A:
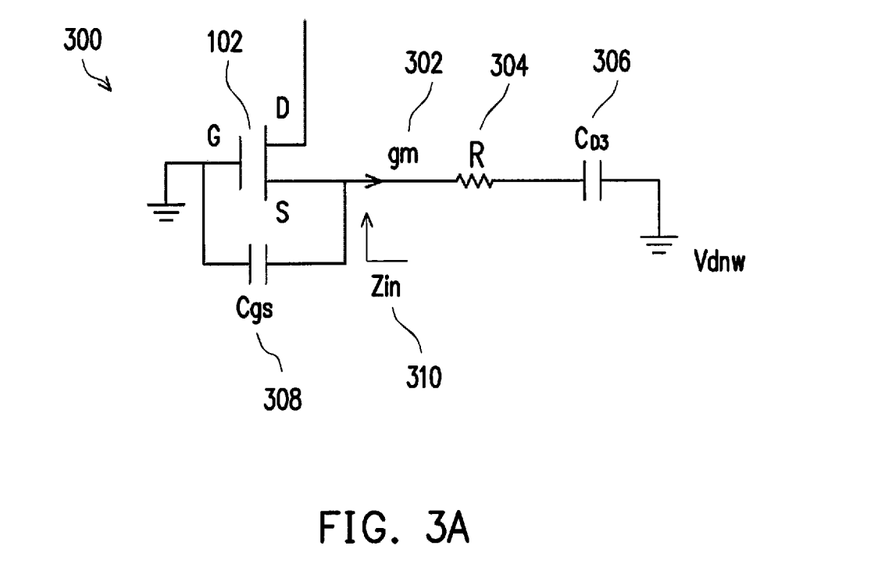
FIG. 3A illustrates an exemplary small-signal equivalent circuit of a common-gate (CG) transistor in a power amplifier shown in FIG. 1, in accordance with some embodiments of the present disclosure.

FIG. 3A illustrates an exemplary small-signal equivalent circuit 300 of a common-gate (CG) transistor 102 in a power amplifier 100 shown in FIG. 1, in accordance with some embodiments of the present disclosure. In the illustrated embodiments, a voltage source for providing Vdnw at terminal 114 of FIG. 1 is assumed to be ideal with a negligible impedance. Further, voltage sources in a small-signal mode are considered as ideal ground. In the illustrated embodiments, the gate terminal of the CG transistor 102 is also coupled to ground.

In the illustrated embodiment, the equivalent circuit 300 of the CG transistor 102 comprises a small signal parameter for the CG transistor gm 302, a resistance R 304 of the resistor 116 (FIG. 1), an equivalent capacitance ($C_{D3}$) 306 of a parasitic diode D3 and a source-gate capacitance Cgs 308. In some embodiment, an equivalent impedance (Zin) 310 of the equivalent circuit 300 can be determined using the equation below:

$$Z_{in} = \frac{1}{g_m} // \frac{1}{sC_{gs}} // \left(R + \frac{1}{sC_{D3}}\right)$$

In some embodiments, the resistance R 304 is in a range of a few kilo-ohms to tens of kilo-ohms. In some embodiments, the resistance R 304 has a value of 10 kilo-ohms which blocks a current going through the resistance 304 and the equivalent capacitance 306, resulting in an approximation of the equivalent impedance Zin 310 determined below:

$$Z_{in} \approx \frac{1}{g_m} // \frac{1}{sC_{gs}}$$

In the illustrated embodiment, the resistance R 304 can block the small signal from going through the parasitic diode and can push the non-dominant pole to higher frequency so as to improve the frequency response of the power amplifier 100.

Figure 3B:
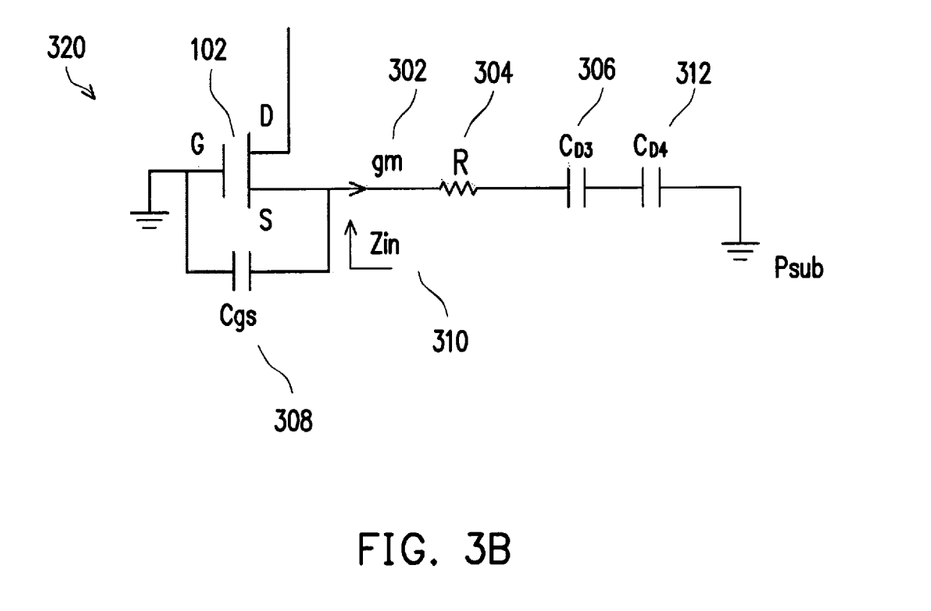
FIG. 3B illustrates an exemplary small-signal equivalent circuit of common-gate (CG) transistor of a power amplifier shown in FIG. 1, in accordance with some embodiments of the present disclosure.

FIG. 3B illustrates an exemplary small-signal equivalent circuit 320 of common-gate (CG) transistor 102 of a power amplifier 100 shown in FIG. 1, in accordance with some embodiments of the present disclosure. In the illustrated embodiments, a voltage source coupled to terminal 114 of FIG. 1 for providing Vdnw is assumed to be non-ideal. In a small-signal mode, the voltage source is thus OPEN. In the illustrated embodiments, the gate terminal of the CG transistor 102 is coupled to an idea voltage source, which is coupled to ground in the equivalent circuit 320.

In the illustrated embodiment, the equivalent circuit 320 of the CG transistor 102 comprises a small signal parameter for the CG transistor gm 302, a resistance R 304, a first equivalent capacitance ($C_{D3}$) 306 of a parasitic diode D3, a second equivalent capacitance ($C_{D4}$) 312 of a parasitic diode D4, and a source-gate capacitance Cgs 308. In some embodiment, an equivalent impedance (Zin) 310 of the equivalent circuit 320 can be determined using the equation below:

$$Z_{in} = \frac{1}{g_m} // \frac{1}{sC_{gs}} // \left(R + \frac{1}{s(C_{D3}//C_{D4})}\right)$$

In some embodiments, the resistance R 304 has a relatively large value (e.g., 10 kilo-ohm) which blocks a current going through the resistance 304, the first equivalent capacitance 306, and the second equivalent capacitance 312, resulting in an approximation of the equivalent impedance Zin 310 determined below:

$$Z_{in} \approx \frac{1}{g_m} // \frac{1}{sC_{gs}}$$

In the illustrated embodiment, the resistance R 304 can block the small signal from going through the parasitic diode and can push the non-dominant pole to higher frequency so as to improve the frequency response of the power amplifier 100.

Figure 4:
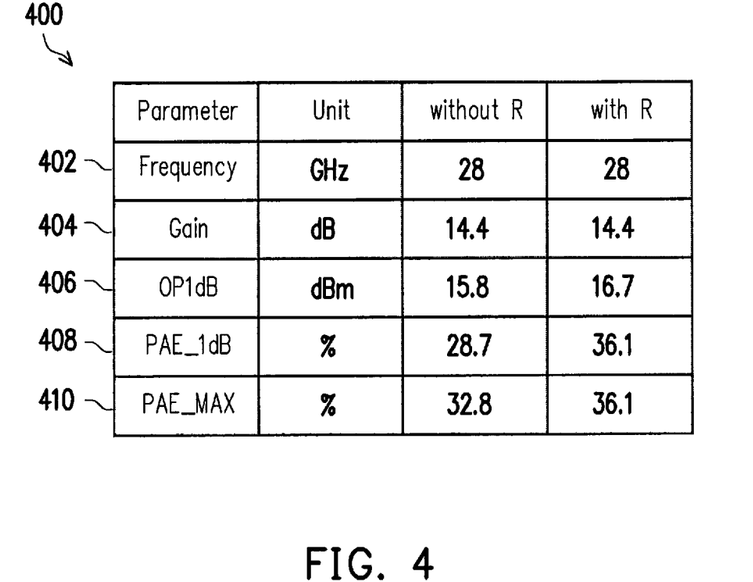
FIG. 4 illustrate a table showing simulation results comparing performances of a power amplifier with and without a resistor coupled between source and body terminals of a common-gate (CG) transistor, in accordance with some embodiments of the present disclosure.

FIG. 4 illustrate a table 400 showing simulation results comparing performances of a power amplifier with and without a resistor coupled between source and body terminals of a common-gate (CG) transistor 102, in accordance with some embodiments of the present disclosure. In the illustrated embodiment, the table 400 comprises 5 parameters, including frequency 402, gain 404, output power at 1 decibel compression (OP1dB) 406, power added efficiency at 1 dB (PAE_1dB) 408, and maximum power added efficiency (PAE_MAX) 410. In some embodiments, the OP1dB 406 is defined as the output power level at which the actual gain deviates from the small signal gain by 1 dB. In some embodiments, the PAE is defined as the ratio of the difference of the output and input RF signal power to the DC power consumed, i.e., PAE=($P_{RF\_OUT}$−$P_{RF\_IN}$)/$P_{DC}$= ($P_{RF\_OUT}$−$P_{RF\_IN}$)/($V_{DC\_IDC}$).

In the illustrated embodiment, at a frequency of 28 giga-hertz (GHz), a gain 406 of 14.4 dB is achieved for both of the power amplifiers with and without the resistor 116. The OP1dB, PAE_1dB, and PAE_MAX are 15.8 dBm, 28.7%, and 32.8% for the power amplifier without the resistor 116. As shown in the table 400, the OP1dB, PAE_1dB, and PAE_MAX are 16.7 dBm, 36.1%, and 36.1% for the power amplifier with the resistor 116. The improvement in PAE is primarily caused by a reduced leakage from the source terminal to the body terminal of the CG transistor 102 by adding the resistor 116.

Figure 5:
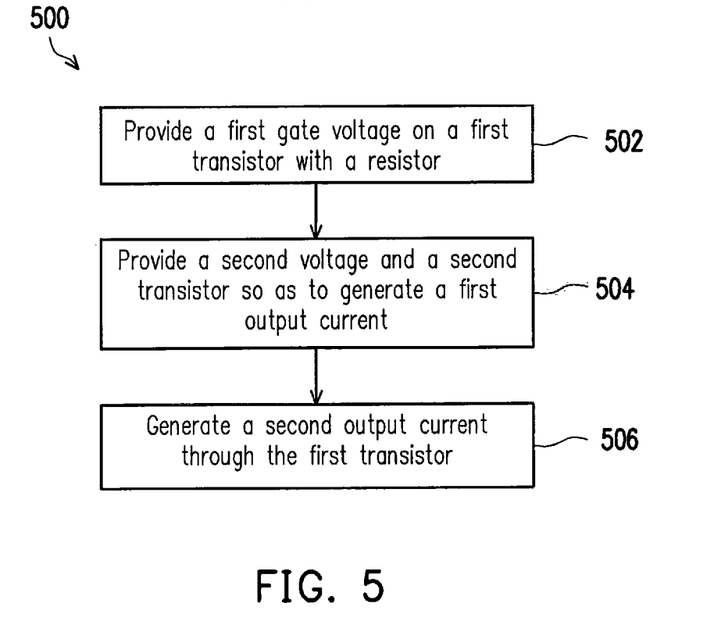
FIG. 5 illustrates a flow chart of a method to operate a power amplifier shown in FIG. 1, in accordance with some embodiments of present disclosure.

FIG. 5 illustrates a flow chart of a method 500 to operate a power amplifier 100 shown in FIG. 1, in accordance with some embodiments of present disclosure. In some embodiments, the operations of method 500 are performed by the respective components illustrated in FIGS. 1-2. For purposes of discussion, the following embodiment of the method 500 will be described in conjunction with FIGS. 1-2. The illustrated embodiment of the method 500 is merely an example for operating the power amplifier 100. Therefore, it should be understood that any of a variety of operations may be omitted, re-sequenced, and/or added while remaining within the scope of the present disclosure.

The method 500 starts with operation 502 in which a first gate voltage is provided on a first transistor with a first resistor according to some embodiments. In some embodiments, the first transistor is a common-gate (CG) amplifier 102. In some embodiments, the first resistor 116 is configured to directly couple source terminal and body terminal of the CG transistor 102. In some embodiments, the resistance value of the first resistor 116 is 10 kilo-ohm when operating at a frequency of 28 Giga-Hertz. The body terminal of the CG amplifier 102 is coupled to Vdnw to prevent latch-up occurrence. In some embodiments, the Vdnw is coupled directly to VDD.

The method 500 continues with operation 504 in which a second gate voltage is provided on a second transistor according to some embodiments. In some embodiments, the second transistor is a common-source (CS) amplifier 104. In some embodiments, the first transistor and the second transistor are coupled in series, wherein source terminal of the CG amplifier 102 is coupled to drain terminal of the CS amplifier 104. Source terminal of the CS amplifier 104 is coupled to GND and drain terminal of the CG amplifier 102 is coupled to VDD. Source terminal is further coupled to body terminal of the CS amplifier 104. In some embodiments, the source terminal of the CS amplifier 104 is also coupled to the gate amplifier through a second resistor and the second gate voltage is provided to the gate terminal of the CS amplifier 104 through a capacitor 118. When the second voltage is applied on the second transistor, a first output current through the second transistor is generated between the drain terminal and the source terminal.

The method 500 continues with operation 506 in which a second output current is generated through the first transistor according to some embodiments. In some embodiments, the second output current is generated between the drain terminal and the source terminal of the first transistor, which can be delivered to output loads.

Figure 6:
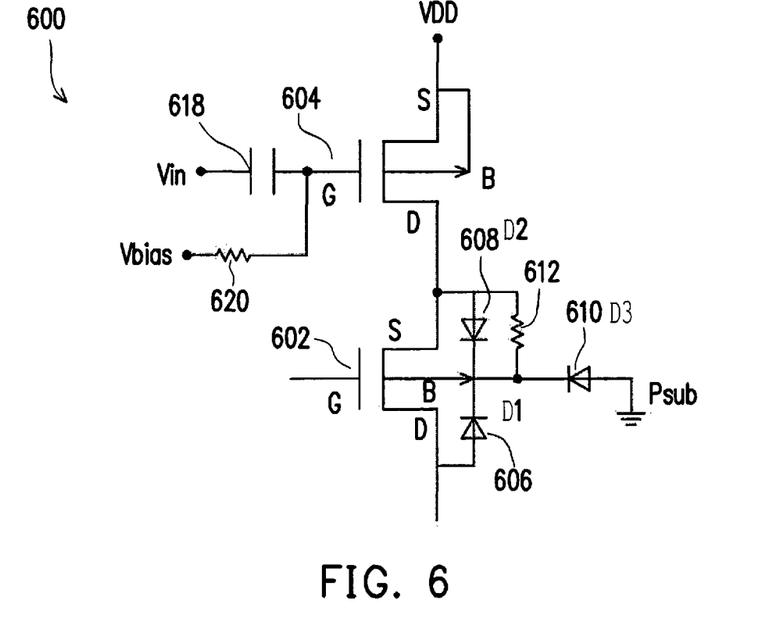
FIG. 6 illustrates an exemplary equivalent circuit diagram of a power amplifier, in accordance with some embodiments of present disclosure.

FIG. 6 illustrates an exemplary equivalent circuit diagram of a power amplifier 600, in accordance with some embodiments of present disclosure. In the illustrated embodiments, the power amplifier 600 comprises a common-gate (CG) amplifier 602 and a common-source amplifier 604. FIG. 6 is simplified for a better understanding of the concepts of the present disclosure. It is understood that the power amplifier 600 may comprise a number of other devices such as resistors, capacitors, inductors, fuses, diodes, etc., which are not shown in FIG. 6, for purposes of clarity of illustration.

In some embodiments, the CG amplifier 602 and the CS amplifier 604 each comprises a p-type metal-oxide-semiconductor (PMOS) transistor. The CG amplifier 602 and the CS amplifier 604 are coupled in series, wherein source terminal of the CG amplifier 602 is coupled to drain terminal of the CS amplifier 604. Source terminal of the CS amplifier 604 is coupled to GND and drain terminal of the CG amplifier 602 is coupled to VDD. Further, in the illustrated embodiments, body terminal of the CG amplifier 602 is coupled to the source terminal of the CG amplifier 602 through a first resistor 612. In some embodiments, the first resistor 612 has a resistance value according to the operation frequency. In some embodiments, the resistance value of the first resistor 612 is 10 kilo-ohm when operating at a frequency of 28 Giga-Hertz. The body terminal of the CG amplifier 602 is coupled to Psub to prevent latch-up. In some embodiments, the Psub is coupled directly to GND. In some embodiments, the gate terminal of the CS amplifier 604 is coupled to an input (Vin) through a capacitor 618 and is further coupled to an external bias Vbias through a second resistor 620. In some embodiments, the Vbias is generated by a biasing circuit.

In the illustrated embodiment, the CG amplifier 602 and CS amplifier 604 are fabricated using a standard CMOS fabrication process by fabricating an N-well in a p-type substrate for effective isolation purposes. In the illustrated embodiments, parasitic diodes formed at junctions between two oppositely doped regions in a corresponding semiconductor device fabricated using the standard CMOS fabrication process are also illustrated. Specifically, a first parasitic diode D1 606 is formed between an P region of the drain terminal of the NMOS transistor 602 and a N-well region; a second parasitic diode D2 608 is formed between an P region of the source terminal of the NMOS transistor 602 and the N-well region; a third parasitic diode D3 610 is formed between the N-well region and the p-type substrate 702, which are discussed further in detail below. All these parasitic diodes are inherent at the junctions and especially, the parasitic diode D3 610 is a triggering source of the latch-up occurrence in such CMOS devices.

Figure 7:
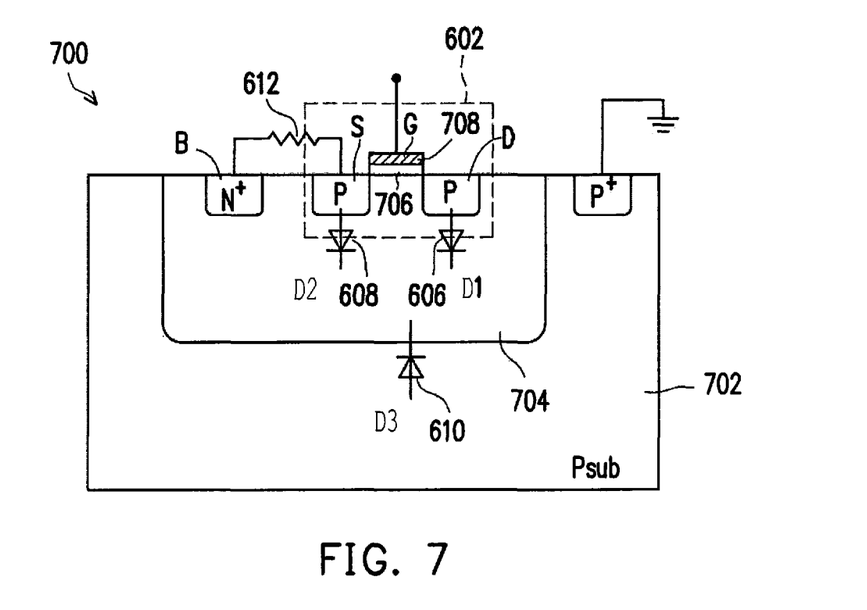
FIG. 7 illustrates a cross-sectional view of a portion of a semiconductor device, in accordance with some embodiments of the present disclosure.

FIG. 7 illustrates a cross-sectional view of a portion of a semiconductor device 700, in accordance with some embodiments of the present disclosure. The semiconductor device 700 may be included in a microprocessor, memory cell, and/or other integrated circuit (IC). Also, FIG. 7 is simplified for a better understanding of the concepts of the present disclosure. It is understood that the semiconductor device 700 may comprise a number of other devices such as resistors, capacitors, inductors, fuses, interconnection metallic layers, vias structures, and insulating layers etc., which are not shown in FIG. 7, for purposes of clarity of illustration.

In some embodiments, the substrate 702 includes a silicon substrate. Alternatively, the substrate 702 may include other elementary semiconductor material such as, for example, germanium. The substrate 702 may also include a compound semiconductor such as silicon carbide, gallium arsenic, indium arsenide, and indium phosphide. The substrate 702 may include an alloy semiconductor such as silicon germanium, silicon germanium carbide, gallium arsenic phosphide, and gallium indium phosphide. In one embodiment, the substrate 702 includes an epitaxial layer. For example, the substrate 702 may have an epitaxial layer overlying a bulk semiconductor. Furthermore, the substrate 702 may include a semiconductor-on-insulator (SOI) structure. For example, the substrate 702 may include a buried oxide (BOX) layer formed by a process such as separation by implanted oxygen (SIMOX) or other suitable technique, such as wafer bonding and grinding. In some embodiments, the substrate 702 is a p-type substrate.

In some embodiments, the semiconductor device 700 can be manufactured using conventional CMOS (complementary metal-oxide-semiconductor) process steps, including patterning using photolithography, deposition of a dielectric layer, etching of the dielectric layer, chemical-mechanical planarization (CMP) process, formation of a gate oxide layer, doping of the substrate, deposition of conductive layers, annealing, patterning metal contacts, formation of ohmic contact silicide, deposition of barrier layers, formation of via structures and interconnections metal lines, and a combination thereof. These processes can be performed by different techniques known to one skilled in the art.

As shown in the illustrated embodiment, a CG amplifier (i.e., PMOS transistor 602) is directly formed in a N-well region 704, which is fabricated in the p-type substrate 702. Source (S) and drain (D) terminals are directly fabricated in the N-well region 704 using heavily doped P regions and body (B) terminal is fabricated in the N-well region 704 using a heavily doped N+ region so as to form an ohmic contact to the N-well region 704. Further in the illustrated embodiment, a heavily doped P+ region is formed directly in the p-type substrate which is coupled to Psub. In some embodiments, the Psub is directly coupled to GND.

In some embodiments, a gate insulator 706 in the PMOS transistor 602 has a thickness of 3-4 nanometers. The thickness of the gate insulator 706 can be varied and controlled by the desired capacitance value, which is a function of the dielectric constant of the dielectric material of the gate insulator 706 and an operational voltage. In some embodiments, the gate insulator 706 in the PMOS transistor 602 comprises various insulating materials such as, for example $SiO_2$, $Al_2O_3$, $HfO_2$, $SiO_2$, $La_2O_3$, $ZrO_3$, Ba—Sr—Ti—O, $Si_3N_4$ and laminate of a mixture thereof. In some embodiments, the gate insulator 706 in the PMOS transistor 602 comprises a high dielectric constant, e.g., a high-k dielectric material. In some embodiments, the gate insulator 706 in the PMOS transistor 602 can be formed by various processes including deposition of the fourth dielectric layer using PVD (physical vapor deposition), CVD (chemical vapor deposition), ALD (atomic layer deposition) and the like, photolithography and a dry/wet etching process.

In some embodiments, a conductive gate 708 can be formed on top of the gate insulator 706. In some embodiments, the conductive gate 708 comprises various conductive materials such as, for example polycrystalline silicon. In some embodiments, a resistor 612 is coupled between the source terminal and the body terminal of the PMOS transistor 602. In the illustrated embodiments, parasitic diodes can be formed between two buried oppositely doped regions. Specifically, a first parasitic diode D1 606 is formed between the P region of the drain terminal of the PMOS transistor 602 and the N-well region 704; a second parasitic diode D2 608 is formed between the P region of the source terminal of the PMOS transistor 602 and the N-well region 704; a third parasitic diode D3 610 is formed between the N-well region 704 and the p-type substrate 702.

Figure 8:
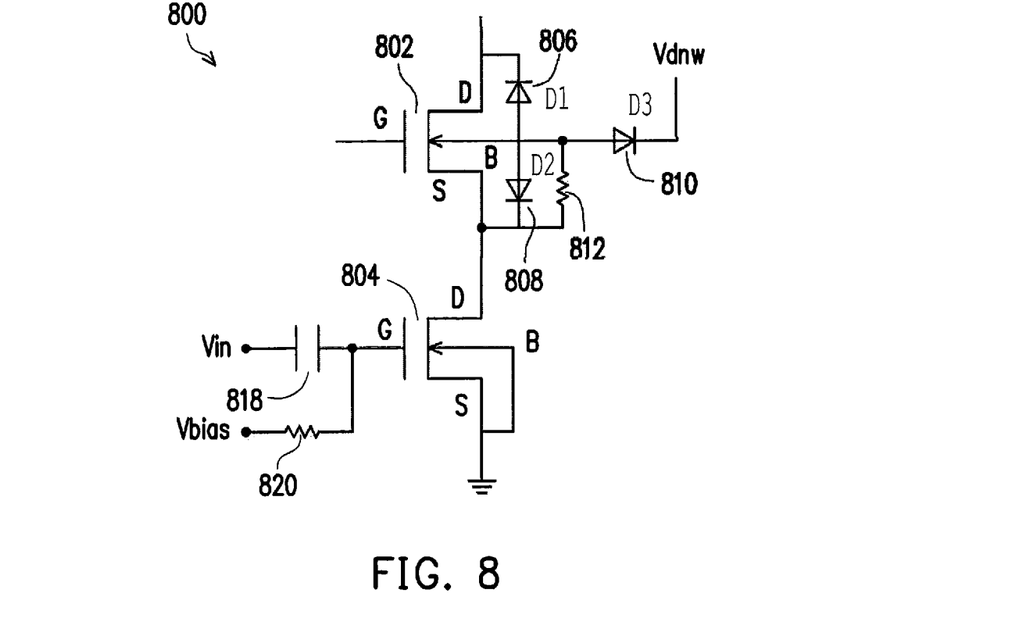
FIG. 8 illustrates an exemplary equivalent circuit diagram of a power amplifier, in accordance with some embodiments of present disclosure.

FIG. 8 illustrates an exemplary equivalent circuit diagram of a power amplifier 800, in accordance with some embodiments of present disclosure. In the illustrated embodiments, the power amplifier 800 comprises a common-gate (CG) amplifier 802 and a common-source (CS) amplifier 804. FIG. 8 is simplified for a better understanding of the concepts of the present disclosure. It is understood that the power amplifier 800 may comprise a number of other devices such as resistors, capacitors, inductors, fuses, diodes, etc., which are not shown in FIG. 8, for purposes of clarity of illustration.

In some embodiments, the CG amplifier 802 and the CS amplifier 804 each comprises an n-type metal-oxide-semiconductor (NMOS) transistor. The CG amplifier 802 and the CS amplifier 804 are coupled in series, wherein source terminal of the CG amplifier 802 is coupled to drain terminal of the CS amplifier 804. Source terminal of the CS amplifier 804 is coupled to GND and drain terminal of the CG amplifier 802 is coupled to VDD. Further, in the illustrated embodiments, body terminal of the CG amplifier 802 is coupled to the source terminal of the CG amplifier 802 through a first resistor 812. In some embodiments, the first resistor 812 has a resistance value according to the operation frequency. In some embodiments, the resistance value of the first resistor 812 is 10 kilo-ohm when operating at a frequency of 28 Giga-Hertz. The body terminal of the CG amplifier 802 is coupled to Vdnw to prevent latch-up. In some embodiments, the Vdnw is coupled directly to VDD. In some embodiments, the gate terminal of the CS amplifier 804 is coupled to an input (Vin) through a capacitor 818 and is further coupled to an external bias Vbias through a second resistor 820. In some embodiments, the Vbias is generated by a biasing circuit.

In the illustrated embodiment, the CG amplifier 802 and CS amplifier 804 are fabricated using a standard CMOS fabrication process by fabricating a P-well in a n-type substrate for effective isolation purposes. In the illustrated embodiments, parasitic diodes formed at junctions between two oppositely doped regions in a corresponding semiconductor device fabricated using the standard CMOS fabrication process are also illustrated. Specifically, a first parasitic diode D1 806 is formed between an N region of the drain terminal of the NMOS transistor 802 and a P-well region; a second parasitic diode D2 808 is formed between an N region of the source terminal of the NMOS transistor 802 and the P-well region; and a third parasitic diode D3 810 is formed between the P-well region and the n-type substrate. All these parasitic diodes are inherent at the junctions and especially, the parasitic diode D3 810 is a triggering source of the latch-up occurrence in such CMOS devices.

Figure 9:
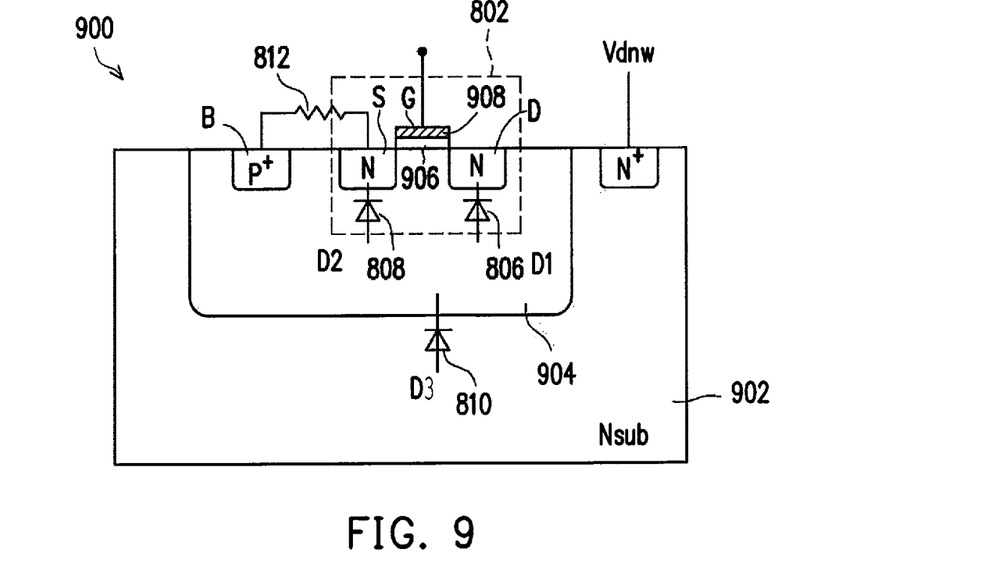
FIG. 9 illustrates a cross-sectional view of a portion of a semiconductor device, in accordance with some embodiments of the present disclosure.

FIG. 9 illustrates a cross-sectional view of a portion of a semiconductor device 900, in accordance with some embodiments of the present disclosure. The semiconductor device 900 may be included in a microprocessor, memory cell, and/or other integrated circuit (IC). Also, FIG. 9 is simplified for a better understanding of the concepts of the present disclosure. It is understood that the semiconductor device 900 may comprise a number of other devices such as resistors, capacitors, inductors, fuses, interconnection metallic layers, vias structures, and insulating layers etc., which are not shown in FIG. 9, for purposes of clarity of illustration.

In some embodiments, the substrate 902 includes a silicon substrate. Alternatively, the substrate 902 may include other elementary semiconductor material such as, for example, germanium. The substrate 902 may also include a compound semiconductor such as silicon carbide, gallium arsenic, indium arsenide, and indium phosphide. The substrate 902 may include an alloy semiconductor such as silicon germanium, silicon germanium carbide, gallium arsenic phosphide, and gallium indium phosphide. In one embodiment, the substrate 902 includes an epitaxial layer. For example, the substrate 902 may have an epitaxial layer overlying a bulk semiconductor. Furthermore, the substrate 902 may include a semiconductor-on-insulator (SOI) structure. For example, the substrate 902 may include a buried oxide (BOX) layer formed by a process such as separation by implanted oxygen (SIMOX) or other suitable technique, such as wafer bonding and grinding. In some embodiments, the substrate 902 is a n-type substrate.

In some embodiments, the semiconductor device 900 can be manufactured using conventional CMOS (complementary metal-oxide-semiconductor) process steps, including patterning using photolithography, deposition of a dielectric layer, etching of the dielectric layer, chemical-mechanical planarization (CMP) process, formation of a gate oxide layer, doping of the substrate, deposition of conductive layers, annealing, patterning metal contacts, formation of ohmic contact silicide, deposition of barrier layers, formation of via structures and interconnections metal lines, and a combination thereof. These processes can be performed by different techniques known to one skilled in the art.

As shown in the illustrated embodiment, a CG amplifier (i.e., NMOS transistor 802) is directly formed in a P-well region 904, which is fabricated in the n-type substrate 902. Source (S) and drain (D) terminals are directly fabricated in the P-well region 904 using heavily doped N regions and body (B) terminal is fabricated in the P-well region 904 using a heavily doped P+ region so as to form an ohmic contact to the P-well region 904. Further in the illustrated embodiment, a heavily doped N+ region is formed directly in the n-type substrate which is further coupled to GND.

In some embodiments, a gate insulator 906 in the NMOS transistor 802 has a thickness of 3-4 nanometers. The thickness of the gate insulator 906 in the NMOS transistor 802 can be varied and controlled by the desired capacitance value, which is a function of the dielectric constant of the dielectric material of the gate insulator 906 in the NMOS transistor 802 and an operational voltage. In some embodiments, the gate insulator 906 in the NMOS transistor 802 comprises various insulating materials such as, for example $SiO_2$, $Al_2O_3$, $HfO_2$, $SiO_2$, $La_2O_3$, $ZrO_3$, Ba—Sr—Ti—O, $Si_3N_4$ and laminate of a mixture thereof. In some embodiments, the gate insulator 906 in the NMOS transistor 802 comprises a high dielectric constant, e.g., a high-k dielectric material. In some embodiments, the gate insulator 906 in the NMOS transistor 802 can be formed by various processes including deposition of the fourth dielectric layer using PVD (physical vapor deposition), CVD (chemical vapor deposition), ALD (atomic layer deposition) and the like, photolithography and a dry/wet etching process.

In some embodiments, a conductive gate 908 can be formed on top of the gate insulator 208. In some embodiments, the conductive gate 908 comprises various conductive materials such as, for example polycrystalline silicon. In some embodiments, a resistor 812 is coupled between the source terminal and the body terminal of the NMOS transistor 802. In the illustrated embodiments, parasitic diodes can be formed between two buried oppositely doped regions. Specifically, a first parasitic diode D1 806 is formed between the N region of the drain terminal of the NMOS transistor 802 and the P-well region 904; a second parasitic diode D2 808 is formed between the N region of the source terminal of the NMOS transistor 802 and the P-well region 904; a third parasitic diode D3 810 is formed between the P-well region 904 and the n-type substrate 902.

Figure 10:
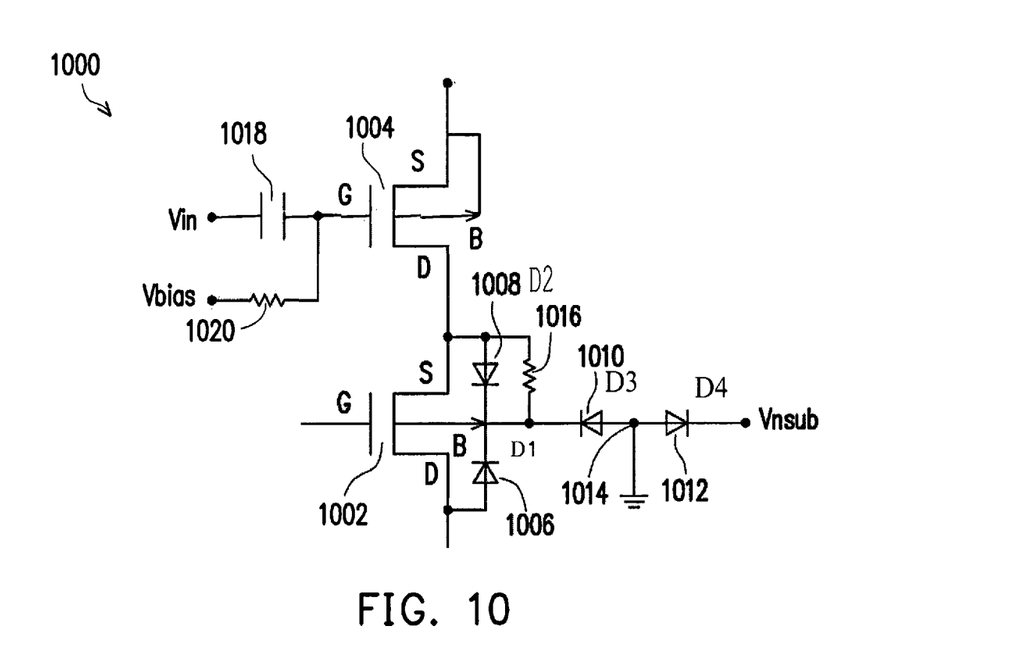
FIG. 10 illustrates an exemplary equivalent circuit diagram of a power amplifier, in accordance with some embodiments of present disclosure.

FIG. 10 illustrates an exemplary equivalent circuit diagram of a power amplifier 1000, in accordance with some embodiments of present disclosure. In the illustrated embodiments, the power amplifier 1000 comprises a common-gate (CG) amplifier 1002 and a common-source amplifier 1004. FIG. 10 is simplified for a better understanding of the concepts of the present disclosure. It is understood that the power amplifier 1000 may comprise a number of other devices such as resistors, capacitors, inductors, fuses, diodes, etc., which are not shown in FIG. 10, for purposes of clarity of illustration.

In some embodiments, the CG amplifier 1002 and the CS amplifier 1004 each comprises a p-type metal-oxide-semiconductor (PMOS) transistor. The CG amplifier 1002 and the CS amplifier 1004 are coupled in series, wherein source terminal of the CG amplifier 1002 is coupled to drain terminal of the CS amplifier 1004. Source terminal of the CS amplifier 1004 is coupled to GND and drain terminal of the CG amplifier 1002 is coupled to VDD. Further, in the illustrated embodiments, body terminal of the CG amplifier 1002 is coupled to the source terminal of the CG amplifier 1002 through a first resistor 1016. In some embodiments, the first resistor 1016 has a resistance value according to the operation frequency. In some embodiments, the resistance value of the first resistor 1016 is 10 kilo-ohm when operating at a frequency of 28 Giga-Hertz. The body terminal of the CG amplifier 1002 is coupled to Vdpw to prevent latch-up. In some embodiments, the Vdpw is coupled directly to GND. In some embodiments, the gate terminal of the CS amplifier 1004 is coupled to an input (Vin) through a capacitor 1018 and is further coupled to an external bias Vbias through a second resistor 1020. In some embodiments, the Vbias is generated by a separate biasing circuit.

In the illustrated embodiment, the CG amplifier 1002 and CS amplifier 1004 are fabricated using a standard CMOS fabrication process by fabricating an N well which is fabricated in a deep P well in an n-type substrate for effective isolation purposes. In the illustrated embodiments, parasitic diodes formed at junctions between two oppositely doped regions in a corresponding semiconductor device fabricated using the standard CMOS fabrication process are also illustrated. Specifically, a first parasitic diode D1 1006 is formed between an P region of the drain terminal of the PMOS transistor 1002 and the N-well region; a second parasitic diode D2 1008 is formed between an P region of the source terminal of the PMOS transistor 1002 and the N-well region; a third parasitic diode D3 1010 is formed between the N-well region and the deep P-well region; and a fourth parasitic diode D4 1012 is formed between the deep P-well region and the n-type substrate 1102, which are discussed further in detail below. All these parasitic diodes are inherent at the junctions and especially, the parasitic diodes D3 1010 and D4 1012 are triggering sources of the latch-up occurrence in such CMOS devices.

Figure 11:
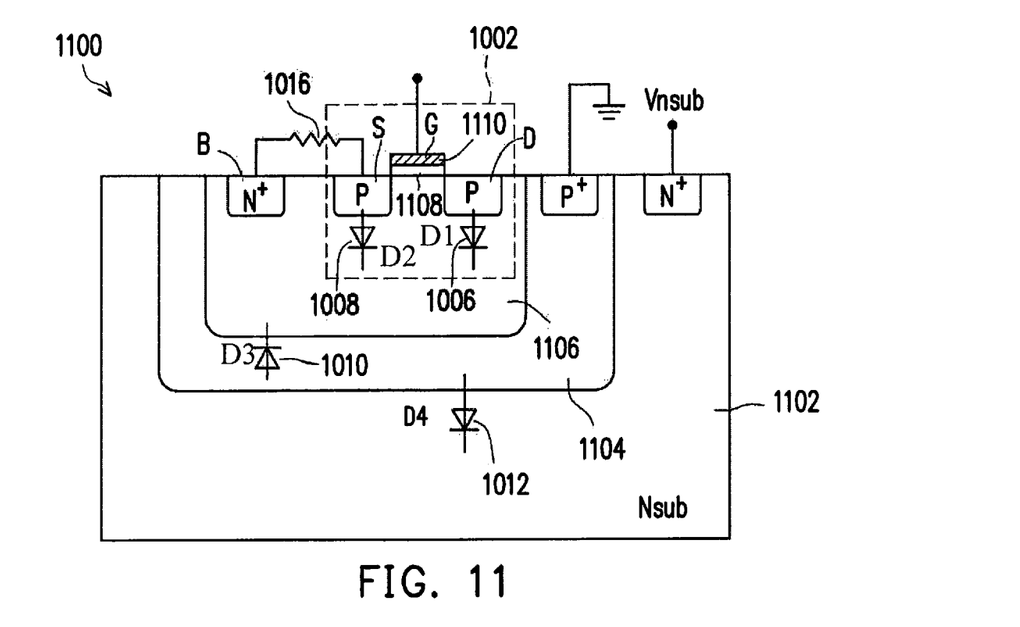
FIG. 11 illustrates a cross-sectional view of a portion of a semiconductor device, in accordance with some embodiments of the present disclosure.

FIG. 11 illustrates a cross-sectional view of a portion of a semiconductor device 1100, in accordance with some embodiments of the present disclosure. The semiconductor device 1100 may be included in a microprocessor, memory cell, and/or other integrated circuit (IC). Also, FIG. 11 is simplified for a better understanding of the concepts of the present disclosure. It is understood that the semiconductor device 1100 may comprise a number of other devices such as resistors, capacitors, inductors, fuses, interconnection metallic layers, vias structures, and insulating layers etc., which are not shown in FIG. 11, for purposes of clarity of illustration.

In some embodiments, the substrate 1102 includes a silicon substrate. Alternatively, the substrate 1102 may include other elementary semiconductor material such as, for example, germanium. The substrate 1102 may also include a compound semiconductor such as silicon carbide, gallium arsenic, indium arsenide, and indium phosphide. The substrate 1102 may include an alloy semiconductor such as silicon germanium, silicon germanium carbide, gallium arsenic phosphide, and gallium indium phosphide. In one embodiment, the substrate 1102 includes an epitaxial layer. For example, the substrate 1102 may have an epitaxial layer overlying a bulk semiconductor. Furthermore, the substrate 1102 may include a semiconductor-on-insulator (SOI) structure. For example, the substrate 1102 may include a buried oxide (BOX) layer formed by a process such as separation by implanted oxygen (SIMOX) or other suitable technique, such as wafer bonding and grinding. In some embodiments, the substrate 1102 is a p-type substrate.

In some embodiments, the semiconductor device 1100 can be manufactured using conventional CMOS (complementary metal-oxide-semiconductor) process steps, including patterning using photolithography, deposition of a dielectric layer, etching of the dielectric layer, chemical-mechanical planarization (CMP) process, formation of a gate oxide layer, doping of the substrate, deposition of conductive layers, annealing, patterning metal contacts, formation of ohmic contact silicide, deposition of barrier layers, formation of via structures and interconnections metal lines, and a combination thereof. These processes can be performed by different techniques known to one skilled in the art.

As shown in the illustrated embodiment, a CG amplifier (i.e., PMOS transistor 1002) is directly formed in an N-well region 1106, which is fabricated in the deep p well 1104 in the n-type substrate 1102. Source (S) and drain (D) terminals are directly fabricated in the N-well region 1106 using heavily doped P regions and body (B) terminal is fabricated in the N-well region 1106 using a heavily doped N+ region so as to form an ohmic contact to the N-well region 1106. Further in the illustrated embodiment, a heavily doped P+ region is formed directly in the deep P-well region 1104 to form an ohmic contact to the deep P-well region which is coupled to Vdpw. In some embodiments, the Vdpw is directly coupled to GND; and a heavily doped N+ region is formed directly in the n-type substrate, which is coupled to Vnsub.

In some embodiments, a gate insulator 1108 in the PMOS transistor 1002 has a thickness of 3-4 nanometers. The thickness of the gate insulator 1108 in the PMOS transistor 1002 can be varied and controlled by the desired capacitance value, which is a function of the dielectric constant of the dielectric material of the gate insulator 1108 in the PMOS transistor 1002 and an operational voltage. In some embodiments, the gate insulator 1108 in the PMOS transistor 1002 comprises various insulating materials such as, for example $SiO_2$, $Al_2O_3$, $HfO_2$, $SiO_2$, $La_2O_3$, $ZrO_3$, Ba—Sr—Ti—O, $Si_3N_4$ and laminate of a mixture thereof. In some embodiments, the gate insulator 1108 in the PMOS transistor 1002 comprises a high dielectric constant, e.g., a high-k dielectric material. In some embodiments, the gate insulator 1108 in the PMOS transistor 1002 can be formed by various processes including deposition of the fourth dielectric layer using PVD (physical vapor deposition), CVD (chemical vapor deposition), ALD (atomic layer deposition) and the like, photolithography and a dry/wet etching process.

In some embodiments, a conductive gate 1110 can be formed on top of the gate insulator 706. In some embodiments, the conductive gate 1110 comprises various conductive materials such as, for example polycrystalline silicon. In some embodiments, a resistor 1110 is coupled between the source terminal and the body terminal of the PMOS transistor 1002. In the illustrated embodiments, parasitic diodes can be formed between two buried oppositely doped regions. Specifically, a first parasitic diode D1 1006 is formed between the P region of the drain terminal of the PMOS transistor 1002 and the N-well region 1106; a second parasitic diode D2 1008 is formed between the P region of the source terminal of the PMOS transistor 1002 and the N-well region 1106; a third parasitic diode D3 1010 is formed between the N-well region 1106 and the deep p-well region 1104; and a fourth parasitic diode D4 1012 is formed between the deep p-well region 1104 and the n-type substrate 1102, wherein the n-type substrate is coupled to Vnsub.

Figure 12:
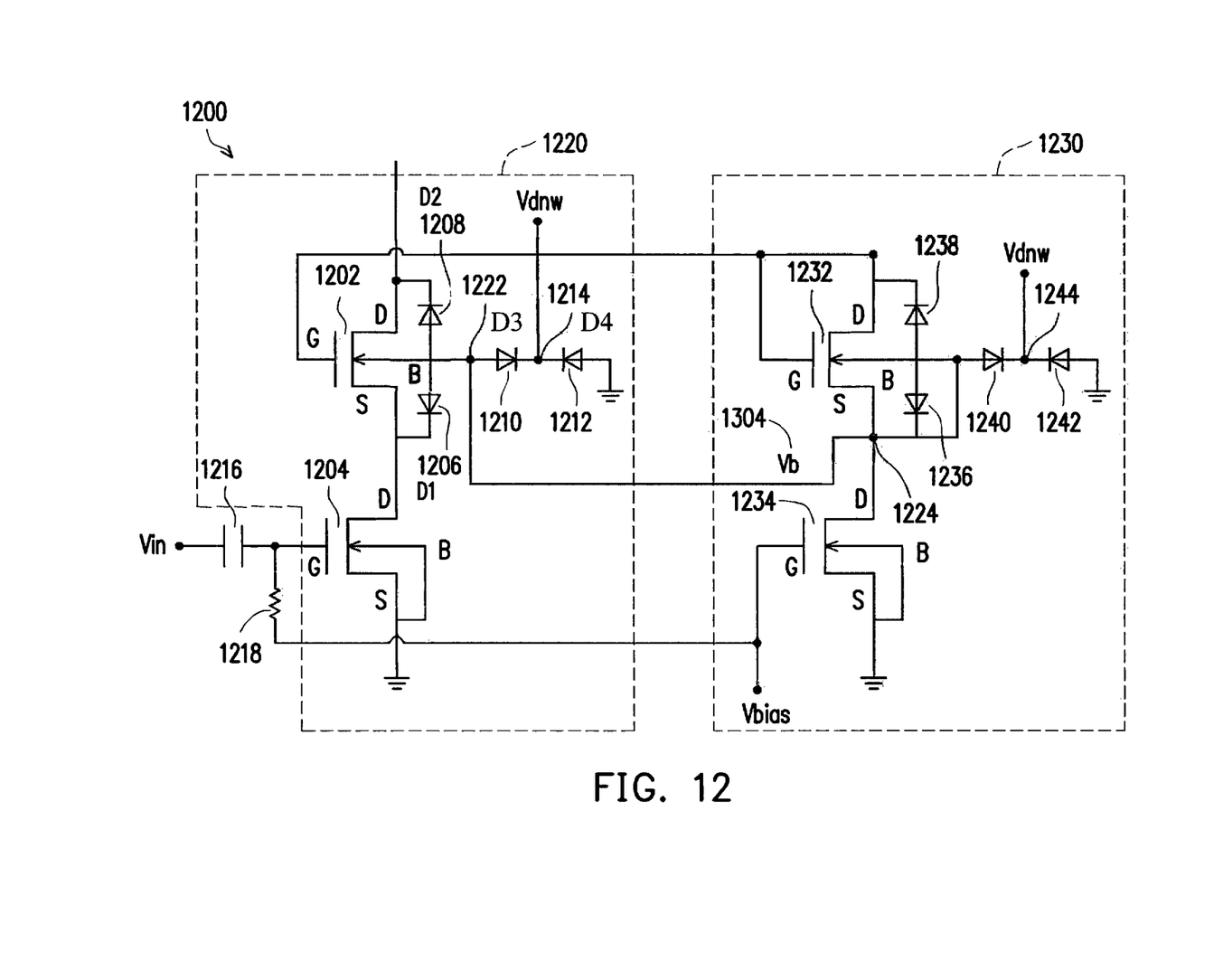
FIG. 12 illustrates an exemplary equivalent circuit diagram of a power amplifier, in accordance with some embodiments of present disclosure.

FIG. 12 illustrates an exemplary equivalent circuit diagram of a power amplifier 1200, in accordance with some embodiments of present disclosure. In the illustrated embodiments, the power amplifier 1200 comprises two separate circuits 1220/1230. Specifically, a first circuit 1220 comprises a common-gate (CG) amplifier 1202 and a common-source amplifier 1204; and a second circuit 1230 comprises 2 transistors in series, e.g., the source terminal of a first transistor 1232 is coupled to the drain terminal of a second transistor 1234. Furthermore, the drain and gate terminals are coupled together in the first transistor 1232. In the illustrated embodiment, the transistor 1232 is configured as a biasing source for the CG amplifier 1202 in the first circuit 1220. FIG. 12 is simplified for a better understanding of the concepts of the present disclosure. It is understood that the power amplifier 1200 may comprise a number of other devices such as resistors, capacitors, inductors, fuses, diodes, etc., which are not shown in FIG. 12, for purposes of clarity of illustration.

In some embodiments, the CG amplifier 1202 and the CS amplifier 1204 in the first circuit 1220 each comprises an n-type metal-oxide-semiconductor (NMOS) transistor. The CG amplifier 1202 and the CS amplifier 1204 are coupled in series, wherein source terminal of the CG amplifier 1202 is coupled to drain terminal of the CS amplifier 1204. Source terminal of the CS amplifier 1204 is coupled to GND and drain terminal of the CG amplifier 1202 is coupled to VDD. Further, in the illustrated embodiments, body terminal of the CG amplifier 1202 is coupled to the source terminal of the CG amplifier 1202. The body terminal of the CG amplifier 1202 is coupled to Vdnw to prevent latch-up at terminal 1214. In some embodiments, the Vdnw is coupled directly to VDD. In some embodiments, the gate terminal of the CS amplifier 1204 is coupled to an input (Vin) through a capacitor 1216 and is further coupled to the gate terminal of the second transistor 1234 through a resistor 1218 and further to an external bias Vbias. In some embodiments, the Vbias is generated by a separate biasing circuit. In the illustrated embodiment, the capacitor 1216 is configured to block DC signals and allow AC signals to pass, while the resistor 1218 is configured to block AC signals and allow DC signals to pass. In some embodiments, a In the illustrated embodiment, the CG amplifier 1202 and CS amplifier 1204 of the first circuit 1220 of the power amplifier 1200 are fabricated using a standard CMOS fabrication process by fabricating a deep N-well in a p-type substrate for effective isolation purposes. In the illustrated embodiments, parasitic diodes formed at junctions between two oppositely doped regions in a corresponding semiconductor device fabricated using the standard CMOS fabrication process are also illustrated. Specifically, a first parasitic diode D1 1206 is formed between an N region of the drain terminal of the NMOS transistor 1202 and a P-well region; a second parasitic diode D2 1208 is formed between an N region of the source terminal of the NMOS transistor 1202 and the P-well region; a third parasitic diode D3 1210 is formed between the P-well region and a deep N-well region; and a fourth parasitic diode D4 1212 is formed between the deep N-well region and a p-type substrate, which are discussed further in detail below. All these parasitic diodes are inherent at the junctions and especially, the parasitic diodes D3 1210 and D4 1212 are triggering sources of the latch-up occurrence in such CMOS devices. In some embodiments, the second circuit 1230 of the power amplifier 1200 is fabricated using the same process. In some embodiments, the aspect ratios of MOS devices, i.e., width and length of MOS devices, are the same. In this configuration, the voltage on the source terminal of the CG amplifier 1202 of the first circuit 1220 equals to the voltage on the source terminal of the amplifier 1232 of the second circuit 1230.

In the illustrated embodiment, the two gate terminals of the amplifiers 1202/1232 are coupled together which is further coupled to the drain terminal of the amplifier 1232; the two body terminals of the CG amplifier 1202 of the first circuit 1220 and the first transistor 1232 of the second circuit 1230 are coupled together at terminals 1222 and 1224. Further, the gate terminal of the second transistor 1234 of the second circuit 1230 is coupled to the gate terminal of the CS amplifier 1204 of the first circuit 1220. This configuration using a replica circuit without adding a resistor between the source terminal and the body terminal of the CG amplifier 1202 allows the source voltage of the CG amplifier 1202 to track with the source voltage of the amplifier 1232 in the replica circuit 1230.

Figure 13A:
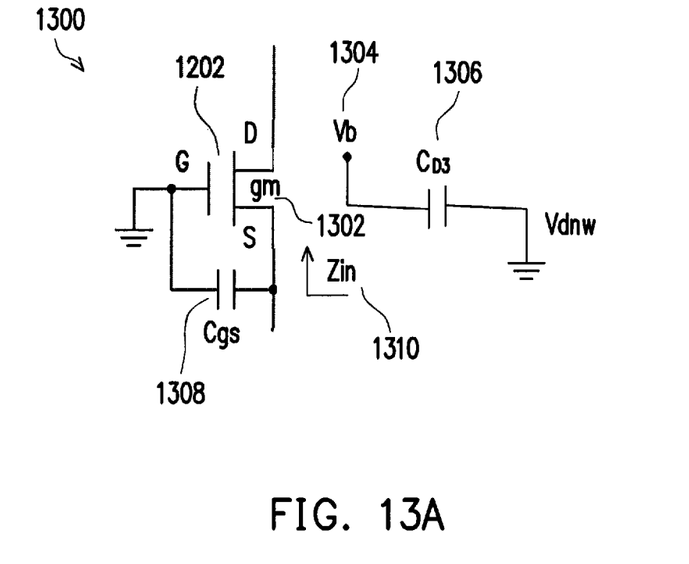
FIG. 13A illustrates an exemplary small-signal equivalent circuit of a common-gate (CG) transistor in a power amplifier shown in FIG. 12, in accordance with some embodiments of the present disclosure.

FIG. 13A illustrates an exemplary small-signal equivalent circuit 1300 of a common-gate (CG) transistor 1202 in a power amplifier 1200 shown in FIG. 12, in accordance with some embodiments of the present disclosure. In the illustrated embodiments, a voltage source for providing Vdnw at terminal 1214 of FIG. 12 is assumed to be ideal with a negligible impedance. Further, voltage sources in a small-signal mode are considered as ideal ground. In the illustrated embodiments, the gate terminal of the CG transistor 1202 is also coupled to ground.

In the illustrated embodiment, the equivalent circuit 1300 of the CG transistor 1202 comprises a small signal parameter for the CG transistor gm 1302, a voltage Vb 1304 at the terminal 1222, an equivalent capacitance ($C_{D3}$) 1306 of a parasitic diode D3, and a source-gate capacitance Cgs 1308. In some embodiment, an equivalent impedance (Zin) 1310 of the equivalent circuit 1300 can be determined using the equation below:

$$Z_{in} \approx \frac{1}{g_m} // \frac{1}{sC_{gs}}$$

In the illustrated embodiment, this configuration blocks the small signal from going through the parasitic diode and can push the non-dominant pole to higher frequency so as to improve the frequency response of the power amplifier 1200.

Figure 13B:
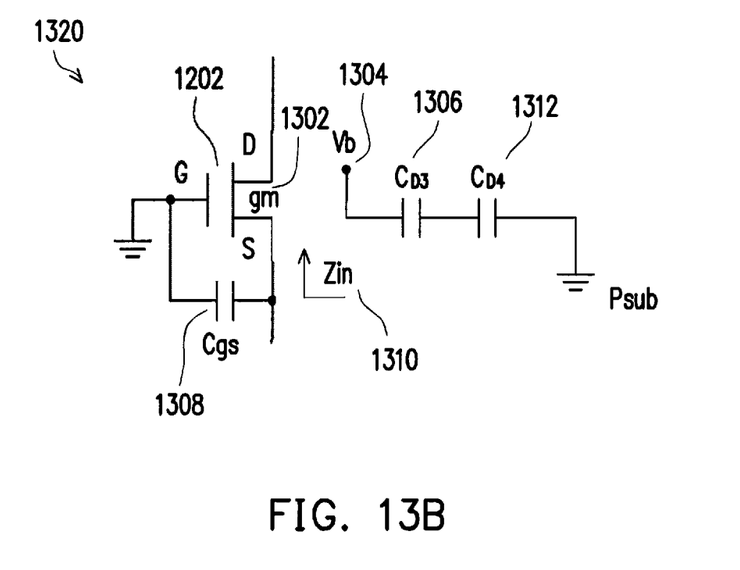
FIG. 13B illustrates an exemplary small-signal equivalent circuit of common-gate (CG) transistor of a power amplifier shown in FIG. 12, in accordance with some embodiments of the present disclosure.

FIG. 13B illustrates an exemplary small-signal equivalent circuit 1320 of common-gate (CG) transistor 1202 of a power amplifier 1200 shown in FIG. 12, in accordance with some embodiments of the present disclosure. In the illustrated embodiments, a voltage source coupled to terminal 1214 of FIG. 1 for providing Vdnw is assumed to be non-ideal. In a small-signal mode, the voltage source is thus OPEN. In the illustrated embodiments, the gate terminal of the CG transistor 1202 is coupled to an idea voltage source, which is coupled to ground in the equivalent circuit 1320.

In the illustrated embodiment, the equivalent circuit 1320 of the CG transistor 1202 comprises a small signal parameter for the CG transistor gm 1302, a voltage Vb 1304 at the terminal 1222, a first equivalent capacitance ($C_{D3}$) 1306 of a parasitic diode D3 1210, a second equivalent capacitance ($C_{D4}$) 1312 of a parasitic diode D4 1212, and a source-gate capacitance Cgs 1308. In some embodiment, an equivalent impedance (Zin) 1310 of the equivalent circuit 1320 can be determined using the equation below:

$$Z_{in} \approx \frac{1}{g_m} // \frac{1}{sC_{gs}}$$

In the illustrated embodiment, the configuration can block the small signal from going through the parasitic diode and can push the non-dominant pole to higher frequency so as to improve the frequency response of the power amplifier 1200.

In one embodiment, an amplifying circuit, includes: a common-gate (CG) amplifier, wherein the CG amplifier comprises a first transistor, wherein source terminal and body terminal of the first transistor is coupled together through a first resistor.

In another embodiment, a power amplifying circuit, includes: a common-gate (CG) amplifier, wherein the CG amplifier comprises a first transistor, wherein source terminal and body terminal of the first transistor is coupled together through a first resistor; and, a common-source (CS) amplifier, wherein the CS amplifier comprises a second transistor in series with the first transistor, wherein source terminal and body terminal of the second transistor are coupled together.

Yet, in another embodiment, a method for operating a power amplifying circuit, includes: providing a first voltage on gate terminal of a common-gate (CG) amplifier; receiving a second voltage on gate terminal of a common-source (CS) amplifier so as to generate a first output current on the CS amplifier; and generating a second output current on the CG amplifier, wherein the CG amplifier comprises a first transistor, wherein source terminal and body terminal of the first transistor is coupled together through a first resistor, and wherein the CS amplifier comprises a second transistor in series with the first transistor, wherein source terminal and body terminal of the second transistor are coupled together.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An amplifying circuit, comprising:
    a common-gate (CG) amplifier, wherein the CG amplifier comprises a first transistor, wherein
        a source terminal and a body terminal of the first transistor are coupled together through a first diode, wherein the first diode is formed between an N region of the source terminal of the first transistor and a P-well region in which the body terminal of the first transistor is fabricated, and
        a drain terminal and the body terminal of the first transistor are coupled together through a second diode; and
    a common-source (CS) amplifier, wherein the CS amplifier comprises a second transistor connected in series with the first transistor, wherein the second transistor is further configured to receive an input voltage at a gate terminal of the CS amplifier.

2. The amplifying circuit of claim 1, wherein
    the second diode is formed between an N region of the drain terminal of the first transistor and the P-well region.

3. The amplifying circuit of claim 1, wherein the first transistor comprises one of the following: an N-type metal-oxide-semiconductor (NMOS) transistor and a P-type MOS (PMOS) transistor.

4. The amplifying circuit of claim 1, wherein the first transistor further comprises:
    a gate insulator; and
    a conductive gate formed on top of the gate insulator.

5. The amplifying circuit of claim 1, wherein the CG amplifier is fabricated in a deep N well of a P-type substrate.

6. The amplifying circuit of claim 1, wherein the CG amplifier is fabricated in a P well of an N-type substrate.

7. The amplifying circuit of claim 1, wherein the second transistor is further configured to receive the input voltage at the gate terminal of the CS amplifier through a capacitor.

8. A power amplifying circuit, comprising:
a common-gate (CG) amplifier, wherein the CG amplifier comprises a first transistor, wherein
  a source terminal and a body terminal of the first transistor are coupled together through a first diode,
  a drain terminal and the body terminal of the first transistor are coupled together through a second diode, and
  the body terminal of the first transistor is coupled to ground; and
a common-source (CS) amplifier, wherein the CS amplifier comprises a second transistor that is connected in series with the first transistor, wherein the second transistor is further configured to receive an input voltage at a gate terminal of the CS amplifier through a capacitor and the gate terminal of the second transistor is coupled to an input voltage through the capacitor and is further coupled to an external bias voltage through a resistor.

9. The power amplifying circuit of claim 8, wherein the first and second transistors each comprises one of the following: an N-type metal-oxide-semiconductor (NMOS) transistor and a P-type MOS (PMOS) transistor.

10. The power amplifying circuit of claim 8, wherein the first transistor further comprises:
  a gate insulator; and
  a conductive gate formed on top of the gate insulator.

11. The power amplifying circuit of claim 8, wherein the CG amplifier is fabricated in a deep N well of a P-type substrate.

12. The power amplifying circuit of claim 8, wherein the CG amplifier is fabricated in a P well of an N-type substrate.

13. The power amplifying circuit of claim 8, wherein the second diode is formed between an N region of the drain terminal of the first transistor and a P-well region in which the body terminal of the first transistor is fabricated.

14. The power amplifying circuit of claim 8, wherein the first diode is formed between an N region of the source terminal of the first transistor and a P-well region in which the body terminal of the first transistor is fabricated.

15. A method making an amplifying circuit, comprising:
forming a common-gate (CG) amplifier in a substrate, wherein the CG amplifier comprises a first transistor, wherein
  a source terminal and a body terminal of the first transistor are coupled together through a first diode, the first diode formed between an N region of the source terminal of the first transistor and a P-well region in which the body terminal of the first transistor is fabricated,
  a drain terminal and the body terminal of the first transistor are coupled together through a second diode, the second diode formed between an N region of the drain terminal of the first transistor and the P-well region, and
  the body terminal of the first transistor is further coupled to ground;
forming a common-source (CS) amplifier in the substrate, wherein the CS amplifier comprises a second transistor connected in series with the first transistor.

16. The method of claim 15, wherein the first transistor comprises one of the following: an N-type metal-oxide-semiconductor (NMOS) transistor and a P-type MOS (PMOS) transistor.

17. The method of claim 15, wherein the first transistor further comprises:
  a gate insulator; and
  a conductive gate formed on top of the gate insulator.

18. The method of claim 15, wherein the CG amplifier is fabricated in a P well of an N-type substrate.

19. The method of claim 18, wherein the second transistor is further configured to receive an input voltage at the gate terminal of the CS amplifier through a capacitor.

20. The method of claim 15, wherein the CG amplifier is fabricated in a deep N well of a P-type substrate.

* * * * *